United States Patent [19]
Nishijima

[11] Patent Number: 6,141,600
[45] Date of Patent: Oct. 31, 2000

[54] RETRYING CONTROL METHOD AND APPARATUS FOR PROCESSING APPARATUS

[75] Inventor: Yuichi Nishijima, Kumamoto, Japan

[73] Assignee: Tokyo Electron Limited, Tokyo, Japan

[21] Appl. No.: 08/959,192

[22] Filed: Oct. 28, 1997

[30] Foreign Application Priority Data

Nov. 19, 1996 [JP] Japan .................................. 8-323405

[51] Int. Cl.$^7$ ..................................... G06F 19/00

[52] U.S. Cl. .......................... 700/114; 700/112; 700/121; 700/228; 414/935

[58] Field of Search .................................. 700/121, 213, 700/228, 230, 245, 56, 11–14, 229, 112–114; 414/416, 797.3, 796.7, 933, 935–941, 934; 438/5; 271/259

[56] References Cited

U.S. PATENT DOCUMENTS 5,620,500  4/1997  Fukui et al. ................................. 95/52
5,633,040  5/1997  Toshima et al. ........................ 437/335

Primary Examiner—William Grant
Assistant Examiner—Steven R. Garland
Attorney, Agent, or Firm—Oblon, Spivak, McClelland, Maier & Neustadt, P.C.

[57] ABSTRACT

Disclosed is a method of controlling a processing apparatus designed to perform a predetermined process for a target processing substrate within a processing chamber after a predetermined operation of a movable member arranged in the processing chamber. The processing apparatus instructs the driving system of the movable member to perform an operation reverse to the predetermined operation when the predetermined operation cannot be confirmed within a defined time, and instructs the driving system to perform the predetermined operation again after the reverse operation is confirmed.

16 Claims, 5 Drawing Sheets

RETRYING CONTROL METHOD AND APPARATUS FOR PROCESSING APPARATUS

BACKGROUND OF THE INVENTION

The present invention relates to a method of controlling a processing apparatus, and a processing apparatus.

For example, in a so-called photoresist processing step in a semiconductor manufacturing process, a target processing substrate such as a semiconductor wafer (to be referred to as a "wafer" hereinafter) is cleaned, its surface is coated with a resist solution to form a resist film, and the substrate is exposed with a predetermined pattern and then developed by a developing solution. The series of processes are performed using a single coating/developing system in which processing apparatuses for respectively processing wafers one by one are collected. In this coating/developing system, a convey means holding a wafer stops in front of the load/unload port of a predetermined processing apparatus. After various movable members on the processing apparatus side perform predetermined operations, the convey means loads the wafer in the apparatus, places it on a predetermined table, and then retreats from the apparatus.

The predetermined operations of the movable members include opening/closing of a shutter in loading/unloading and vertical movement of an elevating pin in placing a wafer in a heating apparatus, vertical movement of a chamber that defines a closed space in an adhesion apparatus, and opening/closing of a shutter and movement of a nozzle arm in a cleaning apparatus and a resist solution coating apparatus. After confirming these operations, the wafer is loaded in the apparatus, and subjected to a predetermined process. Upon completion of the process, the respective operations are executed again to unload the wafer from the apparatus.

The operation of a conventional movable member will be described in accordance with an operation flow. For example, the operation of support pins 103 which appear from a table 102 in a heating apparatus 101 like the one shown in FIG. 1 is performed by the following procedure in accordance with a flow as shown in FIG. 2.

When a controller 104 instructs the support pins 103 to move up (step S101), a pin-up signal is output (step S102). A pin-up sensor 105 detects whether the support pins 103 actually moved up (step S103). If YES in step S103, the predetermined upward operation is complete (step S104), and a wafer is loaded in the apparatus, and subjected to predetermined heating.

If NO in step S103, the flow waits for 5 sec (step S105). After the lapse of 5 sec without detecting upward movement of the support pins 103, an error signal is output (step S106). When the error signal is output, all apparatuses in the system including the heating apparatus 101 are stopped. In this case, the wafer associated with this error is normally treated as a defective.

BRIEF SUMMARY OF THE INVENTION

It is an object of the present invention to provide a control apparatus and method in which, when a predetermined operation of a movable member cannot be confirmed before and after processing a wafer in each processing apparatus, retrying is automatically executed to prevent generation of a defective wafer without taking an excessive measure such as stop of the whole system.

According to the present invention, there is provided the first control method for a processing apparatus which is designed to perform a predetermined process for a target processing substrate within a processing chamber after a predetermined operation of a movable member arranged in the processing chamber, comprising the steps of instructing a driving system of the movable member to perform an operation reverse to the predetermined operation when the predetermined operation cannot be confirmed within a defined time, and instructing the driving system to perform the predetermined operation again after the reverse operation is confirmed. Even if the predetermined operation of the movable member cannot be confirmed before processing the target processing substrate, the movable member is instructed to perform a reverse operation, unlike the conventional apparatus in which an error signal is immediately output. After the reverse operation is confirmed, the movable member is instructed to execute the predetermined operation again. Therefore, the predetermined operation of the movable member can be completed more reliably than the above-described prior art, and subsequent processes for the target processing substrate can be performed.

According to the present invention, there is provided the second control method for a processing apparatus designed to cause a movable member arranged in a processing chamber to perform a predetermined operation in order to unload a target processing substrate from the processing chamber upon completion of a predetermined process for the target processing substrate within the processing chamber, comprising the steps of instructing a driving system of the movable member to perform an operation reverse to the predetermined operation when the predetermined operation cannot be confirmed within a defined time, and instructing the driving system to perform the predetermined operation again after the reverse operation is confirmed. In this manner, when the predetermined operation of the movable member cannot be confirmed after processing the target processing substrate, the movable member is instructed to perform the reverse operation. After the reverse operation is confirmed, the movable member is instructed to execute the predetermined operation again. Similar to the first control method, the predetermined operation of the movable member can be completed more reliably, and the process can shift to a subsequent step.

According to the present invention, there is provided the first processing apparatus which is designed to perform a predetermined process for a target processing substrate within a processing chamber after a predetermined operation of a movable member arranged in the processing chamber, and has a controller that gives an instruction to a driving system for performing the predetermined operation, wherein the controller is designed to instruct the driving system to execute an operation reverse to the predetermined operation when the predetermined operation of the movable member cannot be confirmed within a defined time, and instruct the driving system to execute the predetermined operation again after the reverse operation is confirmed. In this processing apparatus, since the controller is designed to execute so-called "retrying", the first control method of the present invention can be practiced without any change.

According to the present invention, there is provided the second processing apparatus which is designed to cause a movable member arranged in a processing chamber to perform a predetermined operation in order to unload a target processing substrate from the processing chamber upon completion of a predetermined process for the target processing substrate within the processing chamber, and has a controller that gives an instruction to a driving system for performing the predetermined operation, wherein the controller is designed to instruct the driving system to execute an operation reverse to the predetermined operation when the predetermined operation of the movable member cannot be confirmed within a defined time, and instruct the driving system to execute the predetermined operation again after the reverse operation is confirmed. Also in this processing apparatus, since the controller is designed to perform retrying for the movable member upon completion of the predetermined process, the second control method of the present invention can be satisfactorily practiced.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
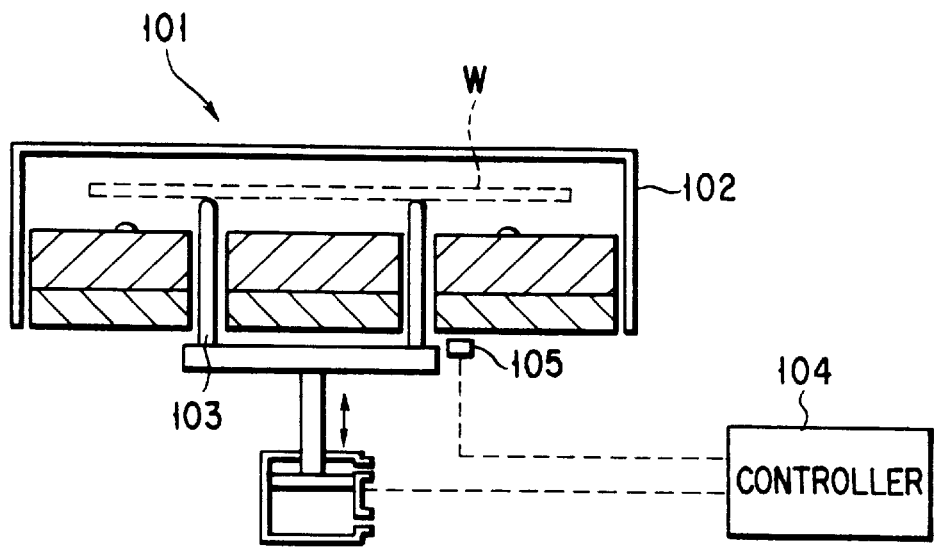
FIG. 1 is a sectional view of a conventional heating apparatus.
Figure 2:
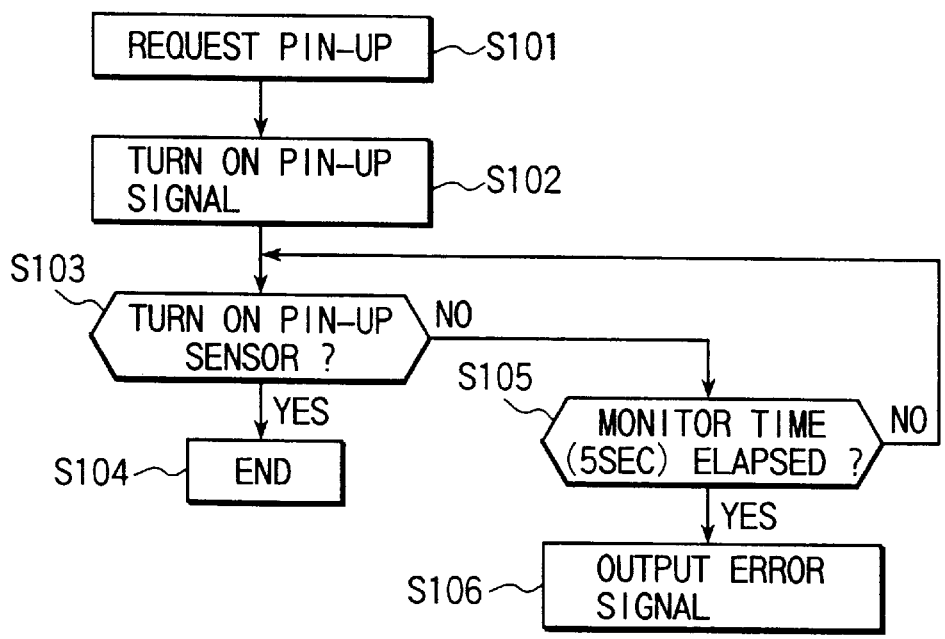
FIG. 2 is a flow chart showing control in moving up conventional support pins.
Figure 3:
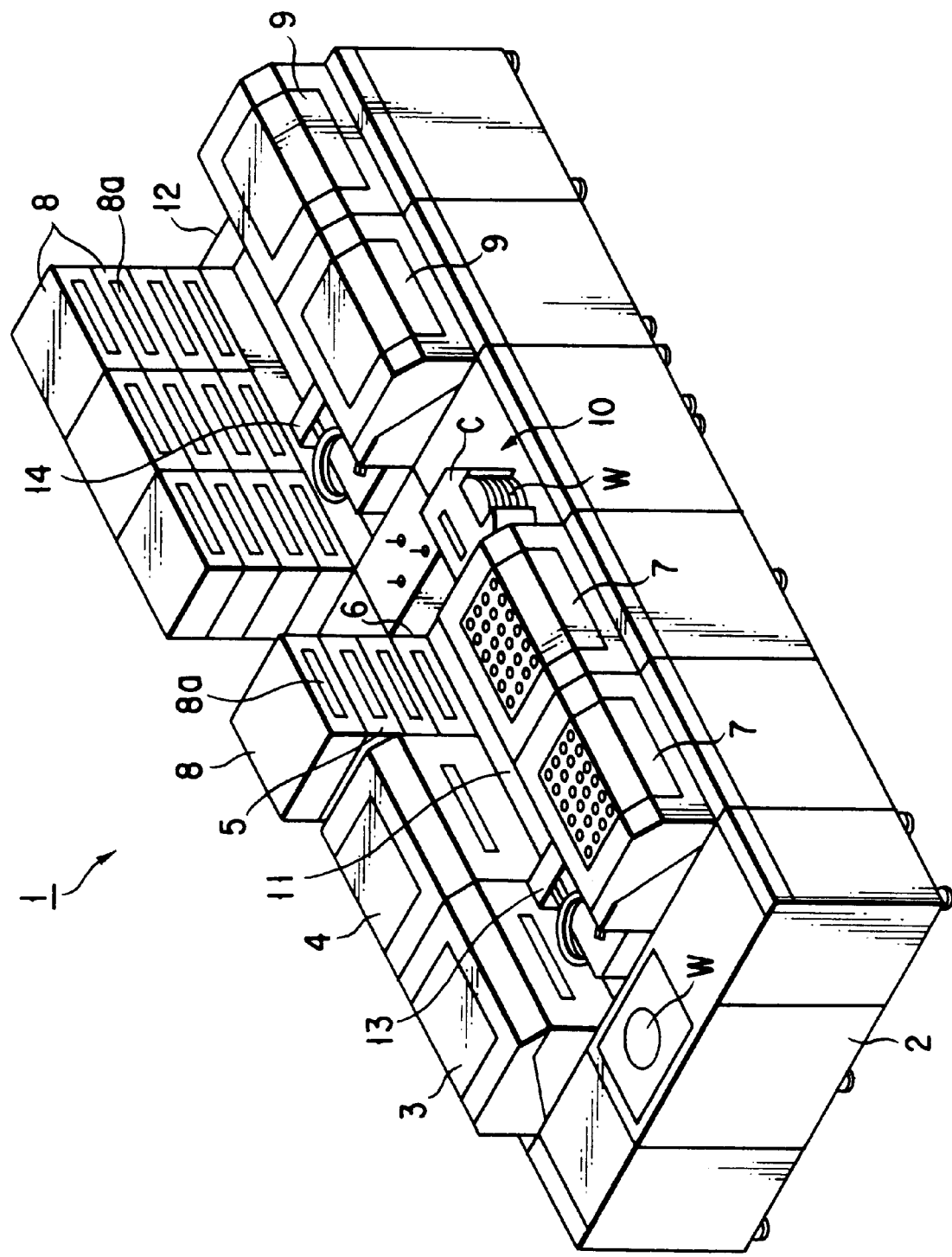
FIG. 3 is a perspective view of a processing system including a heating apparatus according to an embodiment of the present invention.

Embodiments of the present invention will be described below with reference to the several views of the accompanying drawing. This embodiment is designed as a heating apparatus having a controller for controlling the vertical movement of wafer support pins. FIG. 3 shows the outer appearance of a processing system 1 including this heating apparatus.

The processing system 1 has a loader/unloader section 2 in/from which a wafer W serving as a target processing substrate is loaded/unloaded, a brushing apparatus 3 for brushing the wafer W, a jet-water cleaning apparatus 4 for cleaning the wafer W with high-pressure jet water, an adhesion apparatus 5 for hydrophobically treating the surface of the wafer W, a cooling apparatus 6 for cooling the wafer W to a predetermined temperature, a resist solution coating apparatus 7 for applying a resist solution to the surface of the wafer W, a heating apparatus 8 for heating the wafer W before/after applying the resist solution to pre-bake or post-bake the resist film, a developing apparatus 9 for developing the wafer W, and a placing section 10 on which a cassette C for storing a wafer W which may be defective is placed.

Convey paths 11 and 12 are set at the center of the processing system 1 having this arrangement along the longitudinal direction. The respective processing apparatuses from the loader/unloader section 2 to the placing section 10 are arranged on the convey paths 11 and 12 with their fronts being directed to the convey paths 11 and 12. Conveyors 13 and 14 are movable on the corresponding convey paths 11 and 12 in order to transfer the wafer W between the respective processing apparatuses from the loader/unloader section 2 to the placing section 10.

As shown in FIG. 3, the heating apparatus 8 according to this embodiment which is integrated in the processing system 1 is stacked on the adhesion apparatus 5 with its front being directed to the convey path 11 on which the conveyor 13 moves. The front of the heating apparatus 8 has an opening 8a serving as a load/unload port for the wafer W. Note that a plurality of heating apparatus 8 are also arranged on the convey path 12.

Figure 4:
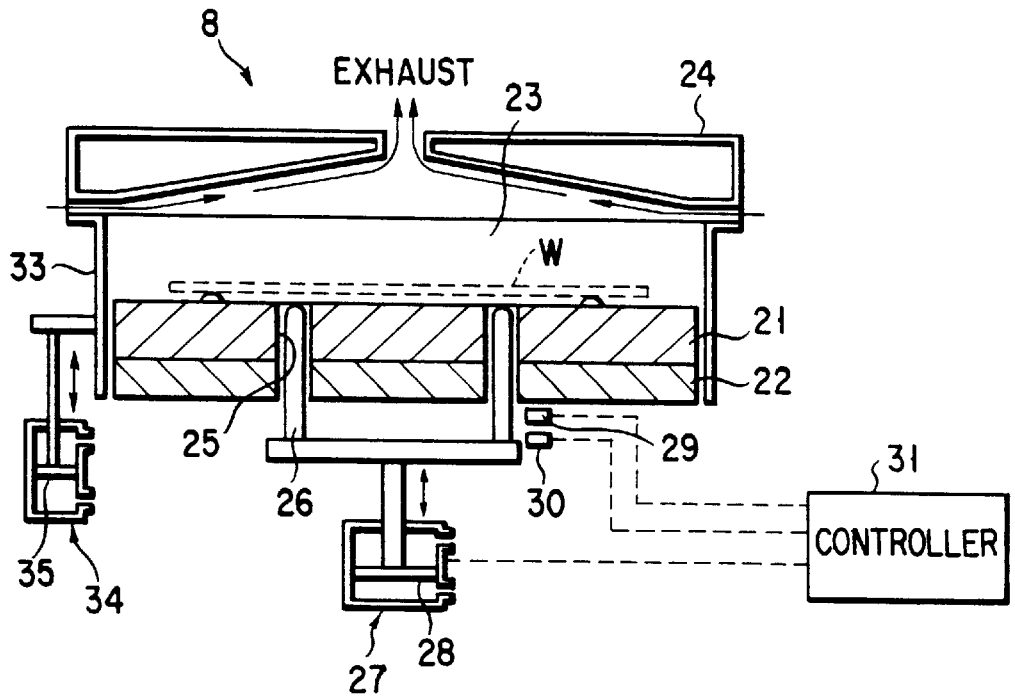
FIG. 4 is a sectional view of the heating apparatus according to the embodiment of the present invention.

As shown in FIG. 4, the main part of the heating apparatus 8 is constituted by a hot plate 21 serving as a table on which the wafer W is placed, a heating element 22 for supplying heat to the wafer W via the hot plate 21, a cover member 24 which is arranged to define a processing space 23 above the hot plate 21, and used to exhaust a gas generated upon heating, and support pins 26 extending through through holes 25 in the hot plate 21 and the heating element 22 to transfer the wafer W to the hot plate 21. The support pins 26 constitute movable members in the present invention.

Figure 5:
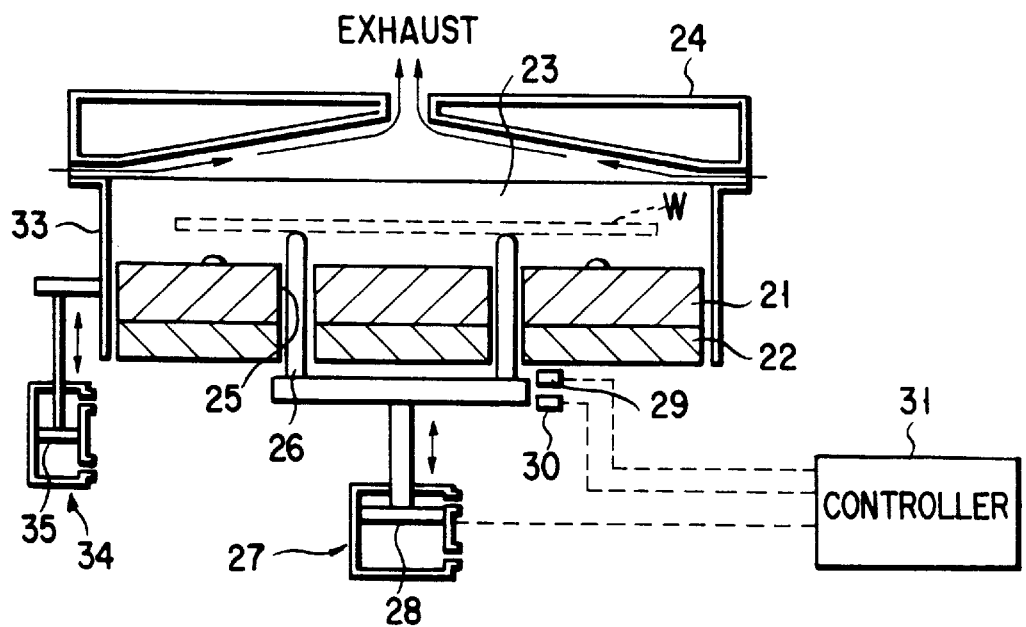
FIG. 5 is a sectional view showing a state wherein support pins move up in the heating apparatus in FIG. 4.

The hot plate 21 and the heating element 22 are fixed, and the support pins 26 can be coupled to a piston 28 of a pin cylinder 27 to be retractable from the hot plate 21. FIG. 5 shows a state wherein the support pins 26 move up to predetermined positions. The vertical movement of the support pins 26 is sensed by a pin-up sensor 29 and a pin-down sensor 30. This information is transmitted to a controller 31. By an instruction from the controller 31, the pin cylinder 27 can be controlled to move up and down the support pins 26. A cylindrical shutter 33 is disposed around the hot plate 21 to be movable up and down. The shutter 33 can be coupled to a piston 35 of a shutter cylinder 34 to separate the processing space 23 from the outside.

A process of heating the wafer W by the heating apparatus 8 according to this embodiment of the present invention in the processing system 1 having the above arrangement will be described. The wafer W in the loader/unloader section 2 is held by the conveyor 13. The wafer W is loaded by the conveyor 13 in, e.g., the brushing apparatus 3, and subjected to predetermined cleaning. Then, the wafer W is unloaded and conveyed by the conveyor 13 toward the heating apparatus 8 to dry the cleaning solution.

Figure 6:
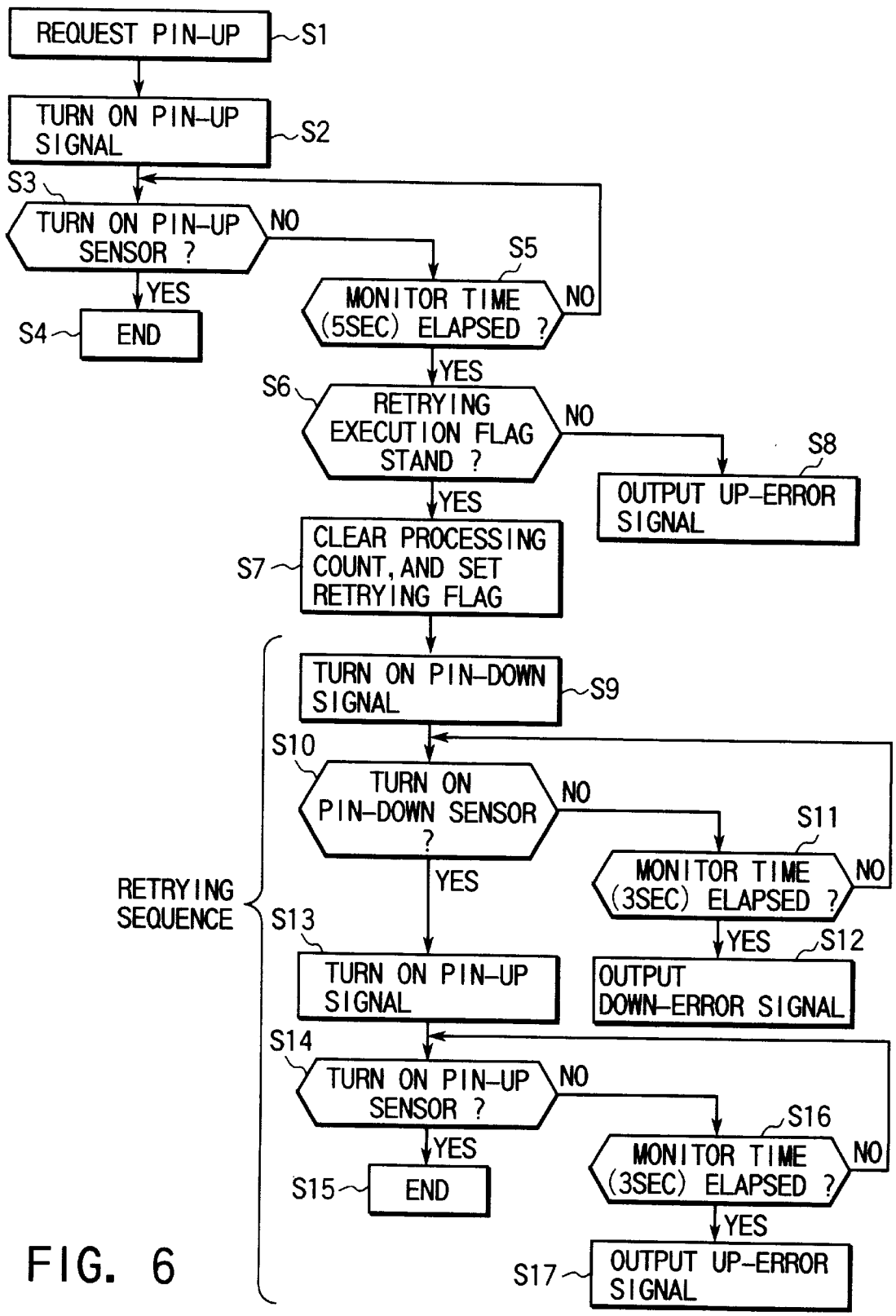
FIG. 6 is a flow chart showing control in moving up the support pins according to the embodiment of the present invention.

Before loading the wafer W, the support pins 26 are moved up and set by a procedure shown in FIG. 6.

When the controller 31 instructs the support pins 26 to move up (step S1), a pin-up signal is output (step S2). The pin-up sensor 29 detects whether the support pins 26 actually moved up (step S3). If YES in step S3, the predetermined upward operation is considered to be complete, as shown in FIG. 6 (step S4). The wafer W is loaded in the apparatus, and subjected to predetermined heating.

If NO in step S3, the flow waits for 5 sec (step S5). After the lapse of 5 sec without detecting upward movement of the support pins 26, whether a retrying execution flag is set is checked (step S6). If YES in step S6, the processing count is cleared, and a retrying flag is set (step S7). If NO in step S6, an up-error signal is output (step S8).

Then, the controller 31 outputs a pin-down signal (step S9). The pin-down sensor 30 detects whether the support pins 26 actually moved down (step S10). If NO in step S10, the flow waits for 3 sec (step S11). After the lapse of 3 sec without detecting downward movement of the support pins 26, a down-error signal is output (step S12).

If YES in step S10, the controller 31 outputs a pin-up signal (step S13). The pin-up sensor 29 detects whether the support pins 26 actually moved up (step S14). If YES in step S14, the support pins 26 are determined to move up to predetermined positions shown in FIG. 5 by retrying (step S15). The wafer W is loaded in the apparatus, and subjected to predetermined heating.

If NO in step S14, the flow waits for 3 sec (step S16). After the lapse of 3 sec without detecting upward movement of the support pins 26, an up-error signal is output (step S17). When the up-error signal is output, all the apparatuses in the processing system 1 including the heating apparatus 8 are stopped.

In this manner, according to the heating apparatus 8 of this embodiment, even if the upward operation of the support pins 26 is not confirmed first, the support pins 26 are moved down, and instructed to move up again upon confirming the downward movement. Therefore, a predetermined upward operation can be completed more reliably than a conventional apparatus wherein, an error signal is output to stop the apparatus immediately after the first upward operation is not confirmed.

In this case, to specify a wafer W associated with retrying, the wafer W may be stored in the cassette C of the placing section 10 immediately upon completion of all process steps in the system or immediately upon completion of a retrying process.

When the upward movement of the support pins 26 is confirmed, the piston 35 of the shutter cylinder 34 moves up to open the shutter 33. The wafer W loaded by the conveyor 13 through the opening 8a is placed on the support pins 26. Then, the shutter 33 is moved down, the support pins 26 are moved down, and the wafer W is heated, e.g., at 100° C. for 30 sec and dried.

In the above manner, the support pins 26 are moved up by the same control method as the procedure shown in FIG. 6 before unloading the wafer W having undergone predetermined heating.

By retrying the upward operation of the support pins 26 also upon completion of heating, a predetermined upward operation can be attained more reliably than the conventional apparatus wherein control is stopped by only the first error signal.

After the support pins 26 move up, the piston 35 of the shutter cylinder 34 goes up to open the shutter 33. The wafer W is unloaded by the conveyor 13 through the opening 8a. Then, the wafer W is subjected to a predetermined process in another processing apparatus, and returned to the loader/unloader section 2.

According to the heating apparatus 8 of this embodiment, when a predetermined upward operation of the support pins 26 is not confirmed, the support pins 26 are instructed to move down. After the downward operation is confirmed, the predetermined upward operation is performed again. Therefore, the upward operation can be accomplished more reliably than the conventional apparatus wherein control is ended immediately after the upward operation is not confirmed first. The whole system need not be stopped immediately after completion of the predetermined upward operation is not confirmed first, and the whole system can be kept operated if the predetermined upward operation is complete by retrying. Even if a wafer is being processed, when the process does not require strict time management, the wafer does not become defective. In a process step requiring strict time management, retrying may not be performed in, e.g., a processing apparatus which treats a wafer coated with a resist solution.

The opening/closing of the shutter 33 of the heating apparatus 8 may be controlled by retrying like the one described above. In addition, retrying may be performed in all the processing apparatuses using movable members of this type, e.g., for vertical movement of a chamber which defines a closed space in the adhesion apparatus 5, and movement of an arm with a nozzle in the brushing apparatus 3 and the jet-water cleaning apparatus 4.

The cassette C of the placing section 10 stores a wafer which may be defective. For example, when retrying is performed for a movable member during a resist processing for a wafer, the wafer may become defective. For this reason, immediately upon completion of all process steps or completion of a retrying process, this wafer may be stored in the cassette C to discriminate this wafer from other wafers in order to specify the defective wafer.

Figure 7:
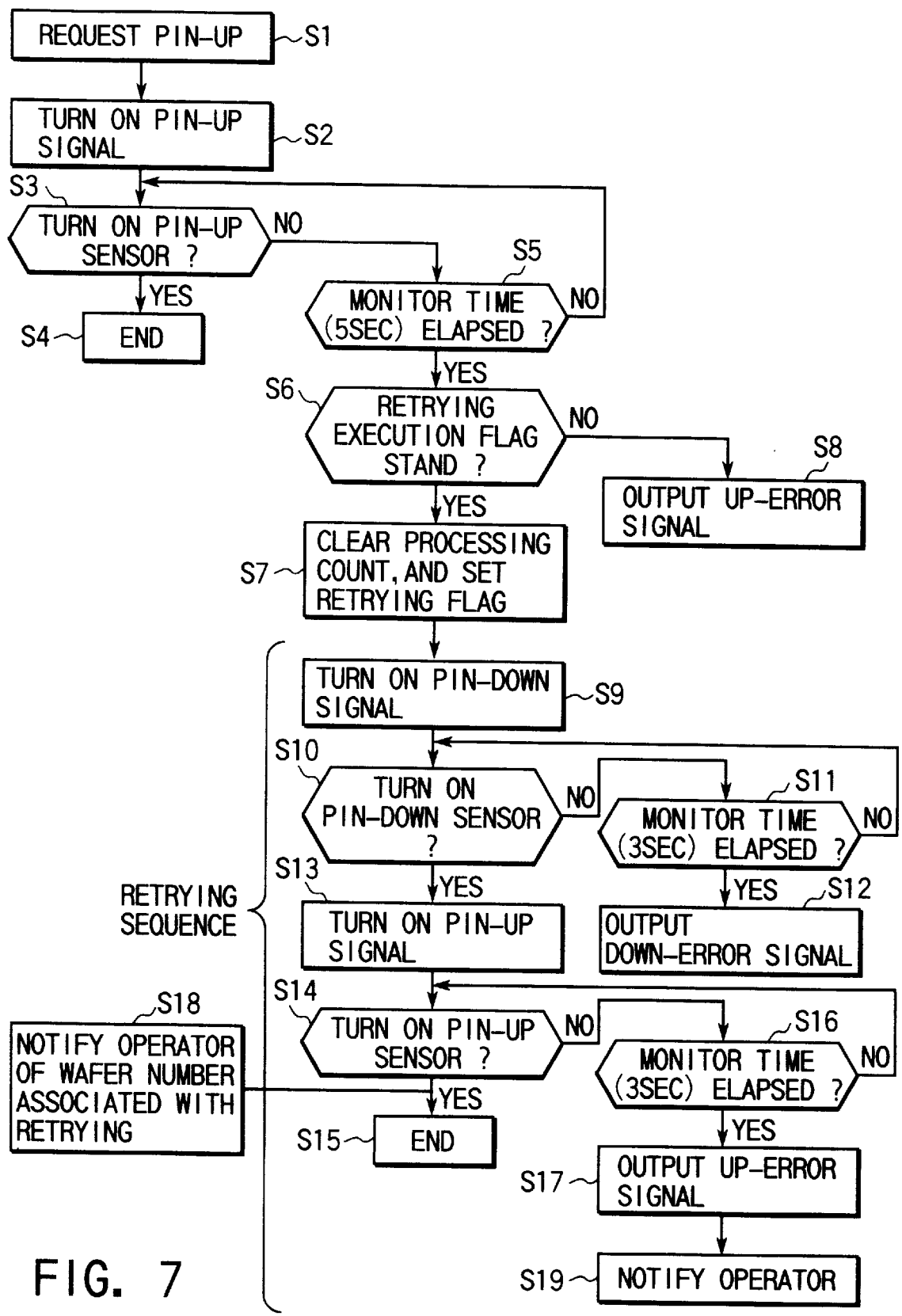
FIG. 7 is a flow chart showing control in moving up the support pins according to the another embodiment of the present invention.

Another embodiment of the present invention will be described below with reference to FIG. 7.

In this embodiment, when the pin-up sensor is turned on, and support pins 26 have been moved up in step S14, the lot number, wafer number, and the like of a wafer W associated with retrying are notified to the operator in step S18. With this notification, the operator can check the features of the wafer upon heating to confirm whether the wafer is nondefective or defective. Since the processing apparatus itself has data about the lot number of the wafer and the wafer number, the operator can specify the wafer associated with retrying by using the data.

Also when an up-error signal is output in step S17, the lot number, wafer number, and the like of a wafer having the error are notified to the operator. With this notification, the operator can specify the defective wafer.

The above embodiments have exemplified the case using the wafer W as a target processing substrate. However, even if the target processing substrate is an LCD substrate, the control apparatus and method of the present invention can be applied.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A method of controlling a processing apparatus which is designed to perform a predetermined process for a target processing substrate within a processing section after a movement substantially parallel to a vertical axis of a movable member arranged in said processing section, comprising:

instructing a driving system of said movable member to perform a movement reverse to the movement substantially parallel to the vertical axis when the movement substantially parallel to the vertical axis cannot be confirmed within a defined time; and instructing said driving system to perform the movement substantially parallel to the vertical axis again after the reverse movement is confirmed.

2. A method according to claim 1, wherein said processing apparatus is one of a heating apparatus and an adhesion apparatus.

3. A method according to claim 1, further comprising notifying an operator of information that specifies said target processing substrate when the movement reverse to the movement substantially parallel to the vertical axis is performed.

4. A method of controlling a processing apparatus designed to cause a movable member arranged in a processing section to perform a predetermined operation in order to unload a target processing substrate from said processing section upon completion of a predetermined process for said target processing substrate within said processing section, comprising:

instructing a driving system of said movable member to perform an operation reverse to the predetermined operation when the predetermined operation cannot be confirmed within a defined time; and instructing said driving system to perform the predetermined operation again after the reverse operation is confirmed.

5. A method according to claim 4, wherein said processing apparatus is one of a heating apparatus and an adhesion apparatus.

6. A method according to claim 5, wherein if one of an ascending operation and a descending operation of a chamber of the adhesion apparatus is not confirmed within the defined time, a retry sequence of one of the ascending operation and the descending operation of the chamber is performed.

7. A method according to claim 5, wherein if an operation of moving a nozzle arm is not confirmed in one of a brushing apparatus and a jet-water cleaning apparatus within the defined time, a retry sequence of moving the nozzle arm is performed.

8. A method according to claim 4, wherein said driving system uses a cylinder.

9. A method according to claim 4, further comprising notifying an operator of information that specifies said target processing substrate when the operation reverse to the predetermined operation is performed.

10. A method according to claim 4, wherein if one of opening and closing operations of a shutter of a heating apparatus is not confirmed within the defined time, a retry sequence of one of opening and closing operations of the shutter is performed.

11. A processing apparatus which is designed to perform a predetermined process for a target processing substrate within a processing section after a movement substantially parallel to a vertical axis of a movable member arranged in said processing section, and has a controller that gives an instruction to a driving system for performing the movement substantially parallel to the vertical axis, wherein said controller has:

determination means for determining whether said movable member performs the movement substantially parallel to the vertical axis within a defined time; and instruction means for instructing said driving system to execute a movement reverse to the movement substantially parallel to the vertical axis when the movement substantially parallel to the vertical axis is not determined to be performed, and instructing said driving system to execute the movement substantially parallel to the vertical axis again after said instruction means confirms the reverse movement.

12. An apparatus according to claim 11, wherein said processing apparatus is one of a heating apparatus and an adhesion apparatus.

13. An apparatus according to claim 11, wherein an operator is notified of information that specifies said target processing substrate when the movement reverse to the movement substantially parallel to the vertical axis is performed.

14. A processing apparatus which is designed to cause a movable member arranged in a processing section to perform a predetermined operation in order to unload a target processing substrate from said processing section upon completion of a predetermined process for said target processing substrate within said processing section, and has a controller that gives an instruction to a driving system for performing the predetermined operation, wherein said controller has:

determination means for determining whether said movable member performs a predetermined operation within a defined time; and instruction means for instructing said driving system to execute an operation reverse to the predetermined operation when the predetermined operation is not determined to be performed, and instructing said driving system to execute the predetermined operation again after said instruction means confirms the reverse operation.

15. An apparatus according to claim 14, wherein said processing apparatus is one of a heating apparatus and an adhesion apparatus.

16. An apparatus according to claim 14, wherein an operator is notified of information that specifies said target processing substrate when the operation reverse to the predetermined operation is performed.

* * * * *